(12) United States Patent
Li et al.

(10) Patent No.: US 7,094,700 B2
(45) Date of Patent: *Aug. 22, 2006

(54) PLASMA ETCHING METHODS AND METHODS OF FORMING MEMORY DEVICES COMPRISING A CHALCOGENIDE COMPRISING LAYER RECEIVED OPERABLY PROXIMATE CONDUCTIVE ELECTRODES

(75) Inventors: Li Li, Meridian, ID (US); Terry L. Gilton, Boise, ID (US); Kei-Yu Ko, Boise, ID (US); John T. Moore, Boise, ID (US); Karen Signorini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/932,282

(22) Filed: Sep. 2, 2004

(65) Prior Publication Data
US 2005/0054207 A1    Mar. 10, 2005

Related U.S. Application Data

(63) Continuation of application No. 10/232,757, filed on Aug. 29, 2002, now Pat. No. 6,831,019.

(51) Int. Cl.
*H01L 21/302* (2006.01)
*H01L 21/3065* (2006.01)

(52) U.S. Cl. .................. 438/706; 438/710; 252/79.1; 252/79.4

(58) Field of Classification Search ............... 438/706, 438/710; 252/79.1, 79.4
See application file for complete search history.

(56) References Cited

U.S. PATENT DOCUMENTS

| 3,271,591 | A | 9/1966 | Ovshinsky |
| 3,622,319 | A | 11/1971 | Sharp |
| 3,743,847 | A | 7/1973 | Boland |
| 3,961,314 | A | 6/1976 | Klose et al. |
| 3,966,317 | A | 6/1976 | Wacks et al. |
| 3,983,542 | A | 9/1976 | Ovshinsky |
| 3,988,720 | A | 10/1976 | Ovshinsky |

(Continued)

FOREIGN PATENT DOCUMENTS

JP          356125845         10/1981

(Continued)

OTHER PUBLICATIONS

U.S. Appl. No. 09/732,968, Gilton, (as filed and amended).

(Continued)

*Primary Examiner*—Nadine G. Norton
*Assistant Examiner*—Lynette T. Umez-Eronini
(74) *Attorney, Agent, or Firm*—Dickstein Shapiro Morin & Oshinsky LLP

(57) ABSTRACT

In one implementation, a plasma etching method comprises forming a $Ge_xSe_y$ chalcogenide comprising layer over a substrate. A mask comprising an organic masking material is formed over the $Ge_xSe_y$ chalcogenide comprising layer. The mask comprises a sidewall. At least prior to plasma etching the $Ge_xSe_y$ comprising layer, the sidewall of the mask is exposed to a fluorine comprising material. After said exposing, the $Ge_xSe_y$ chalcogenide comprising layer is plasma etched using the mask and a hydrogen containing etching gas. The plasma etching forms a substantially vertical side wall of the $Ge_xSe_y$ chalcogenide comprising layer which is aligned with a lateral outermost extent of the sidewall of the mask.

51 Claims, 2 Drawing Sheets

U.S. PATENT DOCUMENTS

| | | |
|---|---|---|
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,114,250 A | 9/2000 | Ellingboe et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,524,963 B1 | 2/2003 | Zhou et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |

| | | |
|---|---|---|
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,686,296 B1 | 2/2004 | Costrini et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,831,019 B1 * | 12/2004 | Li et al. .................. 438/714 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| JP | 358136029 | 8/1983 |
| JP | 5-6126916 | 10/1998 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

U.S. Appl. No. 09/779,983, Moore (as filed and amended).
U.S. Appl. No. 09/797,635, Moore et al. (as filed and amended).
U.S. Appl. No. 09/921,518, Moore (as filed and amended).
U.S. Appl. No. 09/943,187, Campbell et al. (as filed and amended).
U.S. Appl. No. 09/943,190, Campbell et al. (as filed and amended).
U.S. Appl. No. 09/943,199, Campbell et al. (as filed and amended).
U.S. Appl No. 09/999,883, Moore et al. (as filed and amended).
U.S. Appl No. 10/061,825, Gilton et al. (as filed and as amended).
U.S. Appl No. 10/077,867, Campbell et al. (as filed).
U.S. Appl No. 10/193,529, Campbell (as filed).
U.S. Appl No. 10/227,316, Moore et al. (as filed and amended).
Abdel-All, A.; Elshafie,A.; Elhawary, M.M., DC electric-field effect in bulk and thin-film Ge5As38Te57 chalcogenide glass, Vacuum 59 (2000) 845-853.
Adler, D.; Moss, S.C., Amorphous memories and bistable switches, J. Vac. Sci. Technol. 9 (1972) 1182-1189.
Adler, D.; Henisch, H.K.; Mott, S.N., The mechanism of threshold switching in amorphous alloys, Rev. Mod. Phys. 50 (1978) 209-220.
Afifi, M.A.; Labib, H.H.; El-Fazary, M.H.; Fadel, M., Electrical and thermal properties of chalcogenide glass system Se75Ge25−xSbx, Appl. Phys. A 55 (1992) 167-169.
Afifi,M.A.; Labib, H.H.; Fouad, S.S.; El-Shazly, A.A., Electrical & thermal conductivity of the amorphous semiconductor GexSe1−x, Egypt, J. Phys. 17 (1986) 335-342.
Alekperova, Sh.M.; Gadzhieva, G.S., Current-Voltage characteristics of Ag2Se single crystal near the phase transition, Inorganic Materials 23 (1987) 137-139.
Aleksiejunas, A.; Cesnys, A., Switching phenomenon and memory effect in thin-film heterojunction of polycrystalline selenium-silver selenide, Phys. Stat. Sol. (a) 19 (1973) K169-K171.
Angell, C.A., Mobile ions in amorphous solids, Annu. Rev. Phys. Chem. 43 (1992) 693-717.
Aniya, M., Average electronegativity, medium-range-order, and ionic conductivity in superionic glasses, Solid state Ionics 136-137 (2000) 1085-1089.
Asahara, Y.; Izumitani, T., Voltage controlled switching in Cu-As-Se compositions, J. Non-Cryst. Solids 11 (1972) 97-104.
Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.
Axon Technologies Corporation, Technology Description: *Programmable Metalization Cell(PMC)*, pp. 1-6 (Pre-May 2000).
Baranovskii, S.D.; Cordes, H., On the conduction mechanism in ionic glasses, J. Chem. Phys. 111 (1999) 7546-7557.
Belin, R.; Taillades, G.; Pradel, A.; Ribes, M., Ion dynamics in superionic chalcogenide glasses: complete conductivity spectra, Solid state Ionics 136-137 (2000) 1025-1029.
Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.
Benmore, C.J.; Salmon, P.S., Structure of fast ion conducting and semiconducting glassy chalcogenide alloys, Phys. Rev. Lett. 73 (1994) 264-267.
Bernede, J.C., Influence du metal des electrodes sur les caracteristiques courant-tension des structures M-Ag2Se-M, Thin solid films 70 (1980) L1-L4.
Bernede, J.C., Polarized memory switching in MIS thin films, Thin Solid Films 81 (1981) 155-160.
Bernede, J.C., Switching and silver movements in Ag2Se thin films, Phys. Stat. Sol. (a) 57 (1980) K101-K104.
Bernede, J.C.; Abachi, T., Differential negative resistance in metal/insulator/metal structures with an upper bilayer electrode, Thin solid films 131 (1985) L61-L64.
Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2–xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=⅓ in GexSe1–x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1–x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17$^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1–x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2–xSe1+x/n-Si diodes, Thin Solid Films 110 (1983) 107-113.

El Gharras, Z.; Bourahla, A.; Vautier, C., Role of photoinduced defects in amorphous GexSe1–x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80–x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography pp. 24-29 (1982).

Hilt, DISSERTATION: *Materials characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy $GexSe_{1-x}$ around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3-Ag2S, GeS2-GeS-Ag2S and P2S5-Ag2S Glasses, J. Non-Cryst Solids 20(1976) 393-404.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259-269.

Kluge, G.; Thomas, A.; Klabes, R.; Grotzschel, R., Silver photodiffusion in amorphous GexSe100–x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1–x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in $(Ag_xCu_{1-x})_2Se$, J. Phys. Soc. Japan 34 (1973) 423-432.

Miyatani, S.-y., Electrical properties of $Ag_2Se$, J. Phys. Soc. Japan 13 (1958) 317.

Miyatani, S.-y., Ionic conduction in beta-$Ag_2Te$ and beta-$Ag_2Se$, Journal Phys. Soc. Japan 14 (1959) 996-1002, Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of $Ge_xSe_{1-x}$ amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in $Ge_xSe_{1-x}$ and $As_xSe_{1-x}$ systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in $Ag_2Te$ thin films: switching and memory effects, Thin Solid Films 57 (1979) 49-54.

Uemura, O.; Kameda, Y.; Kokai, S.; Satow, T., Thermally induced crystallization of amorphous $Ge_{0.4}Se_{0.6}$, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behaviour in the slope |dTg/d<m>| at the rigidity percolation threshold (<m>=2.4), J. Non-Cryst. Solids 151 (1992) 149-154.

Das et al., "Theory of the characteristic curves of the silver chalcogenide glass inorganic photoresists," 54 Appl. Phys. Lett., No. 18, pp. 1745-1747 (May 1989).

Johnson et al., "Lateral Diffusion in Ag-Se Thin Film Couples," 40 J. Appl. Phys., No. 1, pp. 149-152 (Jan. 1969).

Mitkova, "Real Time Optical Recording on Thin Films of Amorphous Semiconductors," Insulating and Semiconducting Glasses, pp. 813-843 (P. Boolchand ed., World Scientific 2000).

Mizusaki et al., "Kinetic Studies on the Selenization of Silver," 47 B. Chem. Soc. Japan, No. 11, pp. 2851-2855 (Nov. 1974).

Safran et al., "TEM study of $Ag_2Se$ developed by the reaction of polycrystalline silver films and selenium," 317 Thin Solid Films, pp. 72-76 (1998).

Shimakawa et al., "Photoinduced effects and matastability in amorphous semiconductors and insulators," 44 Advances in Physics, No. 6, pp. 475-588 (1995).

Somogyi et al., "Temperature Dependence of the Carrier Mobility in $Ag_2Se$ Layers Grown on NaCl and $SiO_x$ Substrates," 74 Acta Physica Hungarica, No. 3, pp. 245-255 (1994).

Tai et al., "Multilevel Ge-Se film based resist systems, SPIE vol. 333 Submicron Lithography," pp. 32-39 (1982).

Tai et al., "Submicron optical lithography using an inorganic resist/polymer bilevel scheme," 17 J. Vac. Sci. Technol., No. 5, pp. 1169-1175 (Sep./Oct. 1980).

Yoshikawa et al. "A new inorganic electron resist of high contrast," 31 Appl. Phys. Lett., No. 3, pp. 161-163 (Aug. 1977).

Yoshikawa et al., "Dry development of Se-Ge inorganic photoresist," 36 Appl. Phys. Lett., No. 1, pp. 107-117 (Jan. 1980).

* cited by examiner

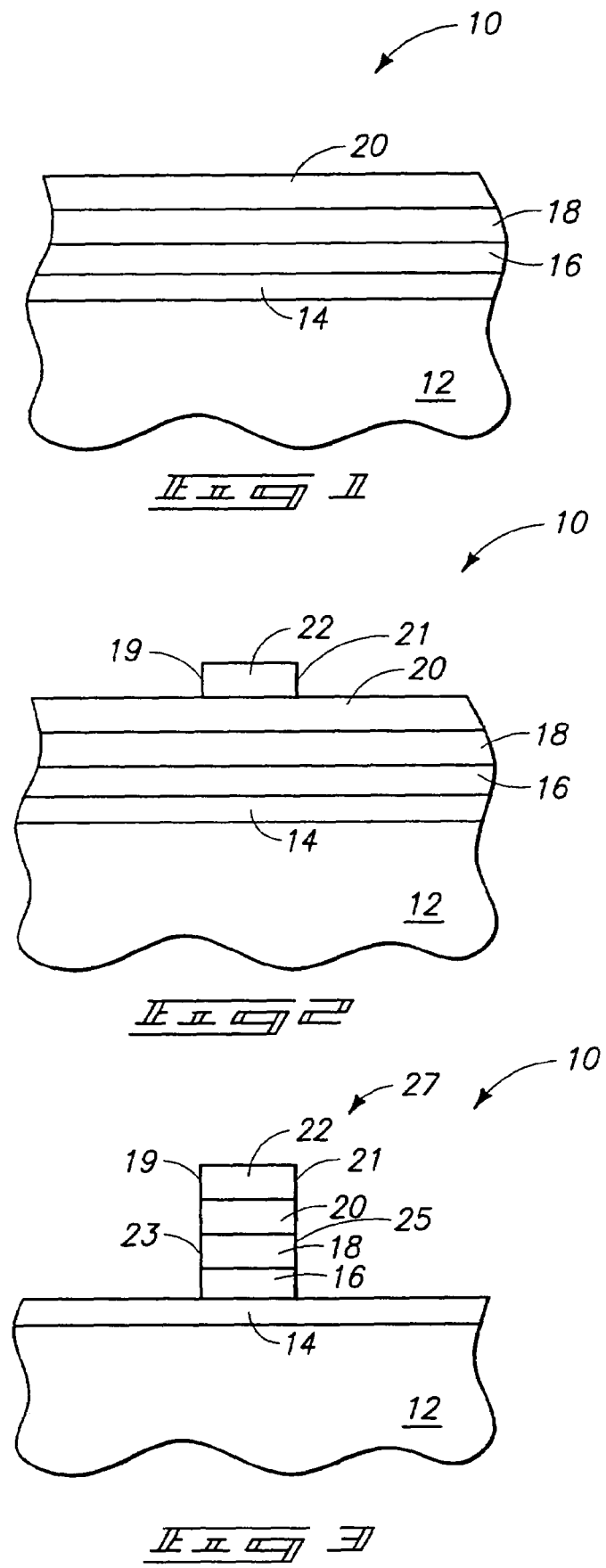

PLASMA ETCHING METHODS AND METHODS OF FORMING MEMORY DEVICES COMPRISING A CHALCOGENIDE COMPRISING LAYER RECEIVED OPERABLY PROXIMATE CONDUCTIVE ELECTRODES

CROSS REFERENCE TO RELATED APPLICATION

The present application is a continuation application of Ser. No. 10/232,757, now U.S. Pat. No. 6,831,019 filed Aug. 29, 2002, the disclosure of which is incorporated herein by reference in its entirety.

TECHNICAL FIELD

This invention relates to methods of forming memory devices comprising a chalcogenide comprising layer received operably proximate conductive electrodes, and to plasma etching methods.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile memory circuitry loses stored data when power is interrupted, while non-volatile memory circuitry retains stored data even when power is interrupted.

U.S. Pat. Nos. 5,761,115; 5,896,312; 5,914,893; and 6,084,796 to Kozicki et al. disclose what is referred to as a programmable metallization cell. Such a cell includes opposing electrodes having an insulating dielectric material received therebetween. Received within the dielectric material is a variable resistance material. The resistance of such material can be changed between low resistance and high resistance states. In its normal high resistance state, to perform a write operation, a voltage potential is applied to a certain one of the electrodes, with the other of the electrodes being held at zero voltage or ground. The electrode having the voltage applied thereto functions as an anode, while the electrode held at zero or ground functions as a cathode. The nature of the resistance variable material is such that it undergoes a change at a certain applied voltage. When such a voltage is applied, a low resistance state is induced into the material such that electrical conduction can occur between the top and bottom electrodes.

Once this has occurred, the low resistance state is retained even when the voltage potential has been removed. Such material can be returned to its highly resistive state by reversing the voltage potential between the anode and cathode. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. One specific example includes one or more layers of germanium selenide ($Ge_xSe_y$) having silver ions diffused therein.

Currently, etching of germanium selenide ($Ge_xSe_y$) is conducted using a halogen containing etching gas, for example chlorine, fluorine, or compounds which include elemental chlorine and/or fluorine. However, such etching methods have limitations, and there remains a need for new plasma etching methods, and for additional methods of forming memory devices comprising a chalcogenide comprising layer.

While the invention was principally motivated in addressing the above issues, it is in no way so limited. The artisan will appreciate applicability of the invention in other aspects unrelated to the above issues, with the invention only being limited by the accompanying claims as literally worded without limiting reference to the specification, and as appropriately interpreted in accordance with the doctrine of equivalents.

SUMMARY

Methods of forming memory devices comprising a chalcogenide comprising layer received operably proximate a pair of conductive electrodes are described. Plasma etching methods are also described. In one implementation, a $Ge_xSe_y$ chalcogenide comprising layer is formed over a substrate. A pair of conductive electrodes is provided operably proximate the $Ge_xSe_y$ chalcogenide comprising layer. Plasma etching of the $Ge_xSe_y$ chalcogenide comprising layer is conducted utilizing an etching gas comprising at least one of $NH_3$, $N_2H_4$ and $C_xH_y$.

In one implementation, a method includes forming a $Ge_xSe_y$ chalcogenide comprising layer over a substrate. A mask comprising an organic masking material is formed over the $Ge_xSe_y$ chalcogenide comprising layer. The mask comprises a first sidewall. The $Ge_xSe_y$ chalcogenide comprising layer is plasma etched using the mask and a hydrogen containing etching gas. Such forms a layer on the first sidewall and forms a second sidewall laterally outward of the first sidewall. The plasma etching forms a substantially vertical sidewall of the $Ge_xSe_y$ chalcogenide comprising layer which is aligned with a lateral outermost extent of the second sidewall.

In one implementation, a plasma etching method comprises forming a $Ge_xSe_y$ chalcogenide comprising layer over a substrate. A mask comprising an organic masking material is formed over the $Ge_xSe_y$ chalcogenide comprising layer. The mask comprises a sidewall. At least prior to plasma etching the $Ge_xSe_y$ comprising layer, the sidewall of the mask is exposed to a fluorine comprising material. After said exposing, the $Ge_xSe_y$ chalcogenide comprising layer is plasma etched using the mask and a hydrogen containing etching gas. The plasma etching forms a substantially vertical sidewall of the $Ge_xSe_y$ chalcogenide comprising layer which is aligned with a lateral outermost extent of the sidewall of the mask.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with one aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

DETAILED DESCRIPTION OF THE PREFERRED EMBODIMENTS

Figure 4:
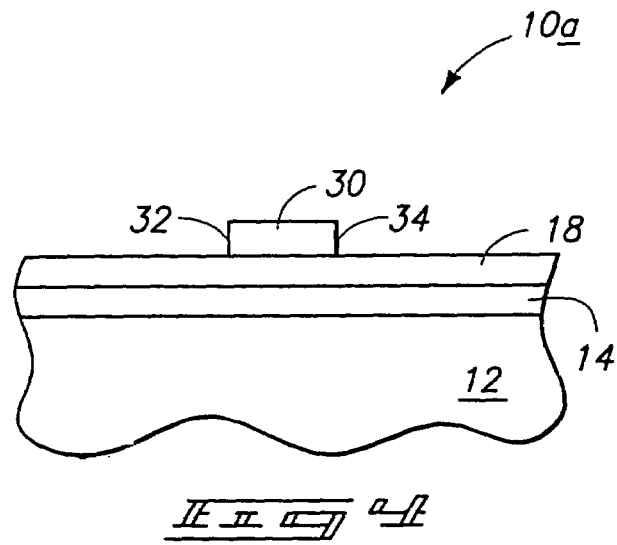
FIG. 4 is a diagrammatic sectional view of a semiconductor wafer fragment at one processing step in accordance with one aspect of the invention.

This disclosure of the invention is submitted in furtherance of the constitutional purposes of the U.S. Patent Laws "to promote the progress of science and useful arts" (Article 1, Section 8).

Preferred embodiments of methods of forming memory devices, and methods of forming germanium selenide comprising structures are described with reference to FIGS. 1–6. FIG. 1 depicts a semiconductor wafer fragment 10, for example comprising a bulk monocrystalline silicon substrate 12. In the context of this document, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material). The term "substrate" refers to any supporting structure, including, but not limited to, the semiconductive substrates described above. Further, in the context of this document, the term "layer" refers to both the singular and plural unless otherwise indicated.

A layer 14 is formed over the substrate 12. Example preferred materials for layer 14 include silicon dioxide ($SiO_2$) and silicon nitride ($Si_3N_4$). A conductive electrode layer 16 is formed over the layer 14. Exemplary materials are conductively doped polysilicon and silver. A $Ge_xSe_y$ chalcogenide comprising layer 18 is formed over the electrode layer 16. The variables "x" and "y" represent preferred molar fractions, preferably each ranging from about 0.1 to about 0.9, and together totaling 1.0. However, additional components might be included. In one preferred embodiment, the $Ge_xSe_y$ chalcogenide comprising layer 18 consists essentially of $Ge_xSe_y$. A conductive electrode layer 20 is formed over the $Ge_xSe_y$ chalcogenide comprising layer 18. Exemplary materials are conductively doped polysilicon and silver.

Referring to FIG. 2, a mask 22 has been formed over the conductive electrode layer 20, and accordingly over layers 18, 16 and 14. Mask 22 preferably comprises an organic masking material, for example organic photoresist. Mask 22 could of course comprise multiple materials and/or layers. Mask 22 has substantially vertical sidewalls 19 and 21. In the context of this document "substantially vertical" means within about 10 degrees of vertical. The substrate 12 is placed in any suitable plasma reactor for plasma etching. The use of any suitable existing or yet-to-be developed plasma reactor is contemplated. Aspects of the invention were reduced to practice using a LAM inductively coupled high-density plasma reactor, using a top inductive coil power of 400 Watts, and a bottom bias power of 200 Watts. Preferred pressure is from about 1 mTorr to about 400 mTorr, with 20 mTorr being a specific example. The substrate holder is preferably cooled during etching, with the substrate preferably reaching a temperature of from about 60° C. to about 70° C.

Referring to FIG. 3, layers 20, 18 and 16 have been etched. Any suitable etching chemistry and method, whether existing or yet-to-be developed, can be used for etching materials in layers 20 and 16. In accordance with one aspect of the invention, $Ge_xSe_y$ chalcogenide comprising layer 18 is plasma etched utilizing an etching gas comprising at least one of $NH_3$, $N_2H_4$ and $C_xH_y$ (for example, $CH_4$). wherein x and y in $C_xH_y$ respectively represents moles of carbon and hydrogen. Any $C_xH_y$ gas which might be utilized can be straight-chained or ringed. Combinations of these hydrogen containing gases, with or without other hydrogen containing gases (i.e., $H_2$), can also be utilized. Of course, additional non-hydrogen containing reactive or inert gases can also be utilized. In one implementation, the etching gas comprises at least any two of $NH_3$, $N_2H_4$ and $C_xH_y$. In one preferred implementation, the etching gas consists essentially of $NH_3$, which it not to be interpreted as precluding presence of non-chemically reactive components in the etching gas.

The depicted FIG. 3 preferred embodiment shows such plasma etching being effective to form substantially vertical sidewalls 23 and 25 of the $Ge_xSe_y$ chalcogenide comprising layer 18, and which are aligned with the substantially vertical sidewalls 19 and 21, respectively, of mask 22. Further in the depicted embodiment, electrode layers 16 and 20 likewise have respective vertical sidewalls which are also so respectively aligned.

The plasma etching of the $Ge_xSe_y$ chalcogenide comprising layer using the preferred etching gas or gases is preferably selective to certain various exposed materials that might otherwise constitute a part of the substrate. In the context of this document, a selective etch, or selectivity, is defined to mean the removal of the $Ge_xSe_y$ chalcogenide comprising layer at a rate of at least 3:1 to that of another stated material. By way of example only, selectivity in such plasma etching is expected relative to $SiO_2$, $Si_3N_4$, titanium and tungsten. An example etching gas feeding to the above-described LAM reactor in such etching includes an $NH_3$ flow of from 1 sccm to 100 sccm, with from about 10 sccm to 50 sccm being more preferred. Additional carrier, physically acting and/or other chemically reactive gases might also be utilized in the context of the invention. Etching selectivity using ammonia and within the above stated parameters has been obtained at 100:1 to undoped silicon dioxide, 40:1 to $Si_3N_4$, 10:1 to titanium and 4:1 to tungsten. The $Ge_xSe_y$ material etched consisted essentially of $Ge_{25}Se_{75}$.

In FIG. 3, the above-described processing results in the formation of an exemplary memory device 27 having a pair of conductive electrodes 16 and 20 formed operably proximate the $Ge_xSe_y$ chalcogenide comprising layer 18. Any other fabrication methods are contemplated (i.e., with or without masking), whether existing or yet-to-be developed, in accordance with the claims as literally worded without interpretative or other limiting reference to the specification, and in accordance with the doctrine of equivalents.

Another exemplary embodiment is described with reference to FIGS. 4 and 5. Like numerals from the first-described embodiment are utilized where appropriate, with differences being indicated by the suffix "a" or with different numerals. Referring to FIG. 4, a mask 30 comprising an organic masking material is formed over, and on as shown, $Ge_xSe_y$ chalcogenide comprising layer 18. An exemplary material for mask 30 includes an organic photoresist, for example as described above in connection with the first described embodiment. Mask 30 comprises at least one first sidewall, with two sidewalls 32 and 34 being shown. Such are typically and preferably substantially vertical.

Figure 5:
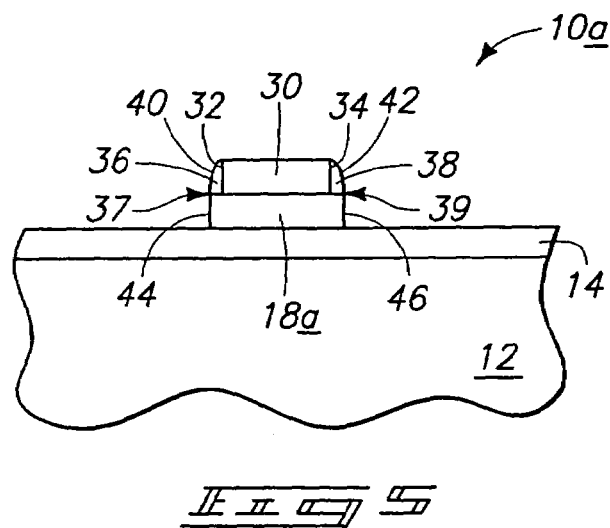
FIG. 5 is a view of the FIG. 4 wafer fragment at a processing step subsequent to that shown by FIG. 4.

Referring to FIG. 5, $Ge_xSe_y$ chalcogenide comprising layer 18 is plasma etched using a hydrogen containing etching gas. Exemplary and preferred hydrogen containing gases are $NH_3$, $H_2$, $N_2H_4$ and $C_xH_y$ (for example, $CH_4$). Any $C_xH_y$ gas which might be utilized can be straight-chained or ringed. Combinations of these hydrogen containing gases, with or without other hydrogen containing gases, can also be utilized. Of course, additional non-hydrogen containing reactive or inert gases can also be utilized. In one implementation, the etching gas comprises at least any two of $NH_3$, $N_2H_4$ and $C_xH_y$. In one preferred implementation, the etching gas consists essentially of $NH_3$, which it not to be interpreted as precluding presence of non-chemically reactive components in the etching gas. Preferred processing conditions are the same as those referred to above with respect to the first-described embodiment.

Such plasma etching may form layers 36 and 38 that are received laterally outward of first sidewalls 32 and 34, respectively, and which have sidewalls 40 and 42, respectively. Sidewalls 40 and 42 would typically be formed to be arcuate at shown, and are accordingly not substantially vertical in one embodiment. Regardless, sidewalls 40 and 42 can be considered as having lateral outermost extents 37 and 39. The illustrated etching of $Ge_xSe_y$ chalcogenide comprising layer 18 forms substantially vertical sidewalls 44 and 46 of the $Ge_xSe_y$ chalcogenide comprising layer 18a which are aligned with second sidewall lateral outermost extents 37 and 39, respectively. By no way of limitation, it is theorized that perhaps the lateral side surfaces of the organic masking material, such as photoresist, are catalyzing decomposition of etching products from layer 18, and which apparently rapidly deposit an organic material 36, 38 on the sidewalls, and which can result in the depicted FIG. 5 etch.

FIG. 5 depicts but one exemplary alternate embodiment of forming a mask, here comprising materials 36, 30 and 38. The $Ge_xSe_y$ chalcogenide comprising layer 18 is plasma etched using mask 36/30/38 and a hydrogen containing etching gas as described above, with such etching forming a substantially vertical sidewall (i.e., at least one of sidewalls 44, 46) of the $Ge_xSe_y$ chalcogenide comprising layer 18a.

Figure 6:
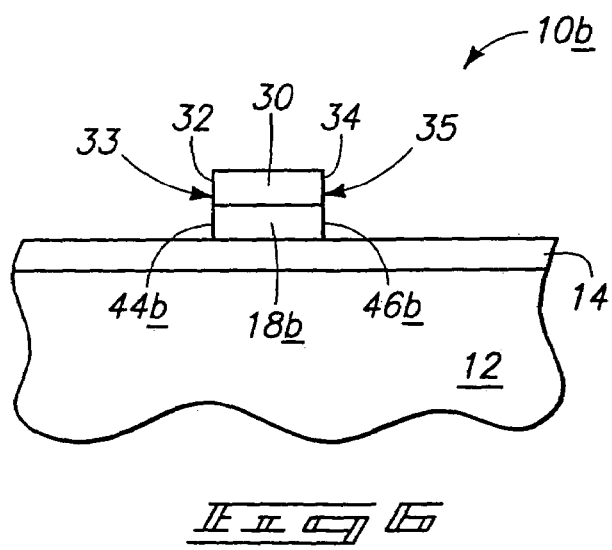
FIG. 6 is a view of the FIG. 4 wafer fragment at a processing step subsequent to that shown by FIG. 4.

By way of example only, another alternate embodiment is described with reference to FIG. 6. Like numerals from the second-described embodiment are utilized where appropriate, with differences being indicated with the suffix "b" or with different numerals. Sidewalls 32 and 34 can be considered as having lateral outermost extents 33 and 35, respectively. In the illustrated preferred embodiment, extents 33 and 35 are coincident with substantially all of walls 32 and 34 due to the substantially vertical nature of such walls. FIG. 6 is similar to the FIG. 5 embodiment, except sidewalls 32 and 34 of mask 30 have been exposed to a fluorine comprising material at least prior to the plasma etching of the $Ge_xSe_y$ chalcogenide comprising layer 18b. By way of example only, exemplary fluorine comprising materials include $F_2$, $CF_4$ and $NF_3$. Preferably, the fluorine exposing is to a fluorine comprising plasma using, for example, any one or combination of the above preferred gases. A reduction-to-practice example included the feeding of $CF_4$ at 5 sccm and He at 100 sccm for about 5 seconds at the conditions referred to above. By way of example only, and in no way of limitation, it is theorized that some form of fluorine atom adherence/passivation occurs to the sidewalls of the masking material which may preclude or restrict such sidewalls from catalyzing decomposition of the etching product that formed the polymer material 36, 38 of FIG. 5. Therefore, the exemplary FIG. 6 embodiment etching in one preferred embodiment can result in substantially vertical sidewalls 44b and 46b which are aligned with lateral outermost extents 33 and 35 of sidewalls 32 and 34, respectively, of mask 30.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A plasma etching method comprising the acts of:
    forming a $Ge_xSe_y$ chalcogenide comprising layer over a substrate;
    forming a mask over the $Ge_xSe_y$ chalcogenide comprising layer, the mask comprising a sidewall;
    plasma etching the $Ge_xSe_y$ chalcogenide comprising layer in the presence of an etching gas, the etching gas comprising at least one of NH3, N2H4, and $C_xH_y$, the plasma etching forming a substantially vertical sidewall of the $Ge_xSe_y$ chalcogenide comprising wherein x and y in $C_xH_y$ respectively represents moles of carbon and hydrogen; layer which is aligned with a lateral outermost extent of the sidewall of the mask wherein x and y in $Ge_xSe_y$ represents molar fractions, and wherein x and y in $C_xH_y$ respectively represents moles of carbon and hydrogen.

2. The method of claim 1, wherein the act of forming the mask comprises forming the sidewall to be substantially vertical.

3. The method of claim 1, further comprising the act of exposing the mask sidewall to a fluorine comprising material prior to the plasma etching act.

4. The method of claim 3, wherein the exposing act comprises exposing the mask sidewall to a fluorine comprising plasma.

5. The method of claim 4, wherein the exposing act comprises exposing the mask sidewall to a fluorine comprising plasma derived at least from $F_2$.

6. The method of claim 4, wherein the exposing act comprises exposing the mask sidewall to a fluorine comprising plasma derived at least from $CF_4$.

7. The method of claim 4, wherein the exposing act comprises exposing the mask sidewall to a fluorine comprising plasma derived at least from $NF_3$.

8. The method of claim 1, further comprising forming an $SiO_2$ layer between the substrate and the $Ge_xSe_y$ chalcogenide comprising layer, wherein the plasma etching selectively etches the $Ge_xSe_y$ chalcogenide comprising layer relative to the $SiO_2$.

9. The method of claim 1, further comprising forming a $Si_3N_4$ layer between the substrate and the $Ge_xSe_y$ chalcogenide comprising layer, wherein the plasma etching selectively etches the $Ge_xSe_y$ chalcogenide comprising layer relative to the $Si_3N_4$.

10. The method of claim 1, further comprising forming a titanium layer between the substrate and the $Ge_xSe_y$ chalcogenide comprising layer, wherein the plasma etching selectively etches the $Ge_xSe_y$ chalcogenide comprising layer relative to the titanium.

11. The method of claim 1, further comprising forming a tungsten layer between the substrate and the $Ge_xSe_y$ chalcogenide comprising layer, wherein the plasma etching selectively etches the $Ge_xSe_y$ chalcogenide comprising layer relative to the tungsten.

12. The method of claim 1, wherein the etching gas comprises $H_2$.

13. The method of claim 1, wherein the etching gas comprises $NH_3$.

14. The method of claim 1, wherein the etching gas comprises $N_2H_4$.

15. The method of claim 1, wherein the etching gas comprises $CH_4$.

16. The method of claim 1, wherein the etching gas comprises $C_xH_y$.

17. The method of claim 1, wherein the etching gas comprises at least two of $NH_3$, $N_2H_4$ and $C_xH_y$.

18. A method of forming a memory device, the method comprising the acts of:
   forming a first conductive electrode layer over a substrate;
   forming a $Ge_xSe_y$ chalcogenide comprising layer over a the first conductive electrode;
   forming a mask over the $Ge_xSe_y$ chalcogenide comprising layer, the mask comprising a sidewall;
   plasma etching the $Ge_xSe_y$ chalcogenide comprising layer in the presence of at least one of $NH_3$, $N_2H_4$, and the plasma etching forming a substantially vertical sidewall of the $Ge_xSe_y$ chalcogenide comprising layer which is aligned with a lateral outermost extent of the sidewall of the mask.

19. The method of claim 18, wherein the act of forming the first conductive electrode layer comprises forming the first conductive electrode layer comprising silver.

20. The method of claim 18, wherein the act of forming the first conductive electrode layer comprises forming the first conductive electrode layer comprising polysilicon.

21. The method of claim 18, further comprising the act of forming a second conductive electrode layer over the $Ge_xSe_y$ chalcogenide comprising layer.

22. The method of claim 21, wherein the act of forming the mask comprises forming the mask over the second conductive electrode layer.

23. The method of claim 21, wherein the act of forming the second conductive electrode layer comprises forming the second conductive electrode layer comprising silver.

24. The method of claim 21, wherein the act of forming the second conductive electrode layer comprises forming the second conductive electrode layer comprising polysilicon.

25. The method of claim 18, further comprising the act of exposing the mask sidewall to a fluorine comprising material prior to the plasma etching act.

26. The method of claim 25, wherein the fluorine comprising material comprises $F_2$.

27. The method of claim 25, wherein the fluorine comprising material comprises $CF_4$.

28. The method of claim 25, wherein the fluorine comprising material comprises $NF_3$.

29. The method of claim 18, further comprising the act of exposing the mask sidewall to a fluorine comprising plasma prior to the plasma etching act.

30. The method of claim 29, wherein the exposing comprises exposing the mask sidewall to a fluorine comprising plasma.

31. The method of claim 29, wherein the exposing act comprises exposing the mask sidewall to a fluorine comprising plasma derived at least from $F_2$.

32. The method of claim 29, wherein the exposing act comprises exposing the mask sidewall to a fluorine comprising plasma derived at least from $CF_4$.

33. The method of claim 29, wherein the exposing act comprises exposing the mask sidewall to a fluorine comprising plasma derived at least from $NF_3$.

34. The method of claim 18, wherein the act of forming the mask comprises forming the sidewall to be substantially vertical.

35. The method of claim 18, further comprising forming a $SiO_2$ layer between the substrate and the first conductive electrode layer, wherein the plasma etching selectively etches the $Ge_xSe_y$ chalcogenide comprising layer relative to the $SiO_2$.

36. The method of claim 18, further comprising forming a $Si_3N_4$ layer between the substrate and the first conductive electrode layer, wherein the plasma etching selectively etches the $Ge_xSe_y$ chalcogenide comprising layer relative to the $Si_3N_4$.

37. The method of claim 18, further comprising forming a titanium layer between the substrate and the first conductive electrode layer, wherein the plasma etching selectively etches the $Ge_xSe_y$ chalcogenide comprising layer relative to the titanium.

38. The method of claim 18, further comprising forming a tungsten layer between the substrate and the first conductive electrode layer, wherein the plasma etching selectively etches the $Ge_xSe_y$ chalcogenide comprising layer relative to the tungsten.

39. The method of claim 18, wherein the etching gas comprises $H_2$.

40. The method of claim 18, wherein the etching gas comprises $NH_3$.

41. The method of claim 18, wherein the etching gas comprises $N_2H_4$.

42. The method of claim 18, wherein the etching gas comprises $CH_4$.

43. The method of claim 18, wherein the etching gas comprises $C_xH_y$.

44. The method of claim 18, wherein the etching gas comprises at least two of $NH_3$, $N_2H_4$ and $C_xH_y$.

45. A method of forming a memory device, the method comprising the acts of:
   forming a first conductive electrode layer over a substrate;
   forming a $Ge_xSe_y$ chalcogenide comprising layer over a the first conductive electrode;
   forming a second conductive electrode layer over the $Ge_xSe_y$ chalcogenide comprising layer;
   forming a mask over the second conductive electrode layer, the mask comprising a sidewall; and
   plasma etching the first and second conductive electrode layers and the $Ge_xSe_y$ chalcogenide comprising layer in the presence of at least one of $NH_3$, $N_2H_4$, and $C_xH_y$, the plasma etching forming a substantially vertical sidewall of the $Ge_xSe_y$ chalcogenide comprising layer which is aligned with a lateral outermost extent of the sidewall of the mask
   wherein x and y in $Ge_xSe_y$ represents molar fractions, and wherein x and y in $C_xH_y$ respectively represents moles of carbon and hydrogen.

46. The method of claim 45, wherein the act of forming the mask comprises forming the sidewall to be substantially vertical.

47. The method of claim 45, further comprising forming a $S_iO_2$ layer between the substrate and the first conductive electrode layer, wherein the plasma etching selectively etches the $Ge_xSe_y$ chalcogenide comprising layer relative to the $S_iO_2$.

48. The method of claim 45, further comprising forming a $Si_3N_4$ layer between the substrate and the first conductive electrode layer, wherein the plasma etching selectively etches the $Ge_xSe_y$ chalcogenide comprising layer relative to the $Si_3N_4$.

49. The method of claim 45, further comprising forming a titanium layer between the substrate and the first conductive electrode layer, wherein the plasma etching selectively etches the $Ge_xSe_y$ chalcogenide comprising layer relative to the titanium.

50. The method of claim 45, further comprising forming a tungsten layer between the substrate and the first conductive electrode layer, wherein the plasma etching selectively etches the $Ge_xSe_y$ chalcogenide comprising layer relative to the tungsten.

51. The method of claim 45, wherein the etching gas comprises at least two of $NH_3$, $N_2H_4$ and $C_xH_y$.

* * * * *

UNITED STATES PATENT AND TRADEMARK OFFICE
CERTIFICATE OF CORRECTION

PATENT NO.        : 7,094,700 B2                                      Page 1 of 1
APPLICATION NO. : 10/932282
DATED             : August 22, 2006
INVENTOR(S)       : Li Li et al.

It is certified that error appears in the above-identified patent and that said Letters Patent is hereby corrected as shown below:

Claim 1, column 6, lines 21-23, delete "wherein x and y in $C_xH_y$ respectively represents moles of carbon and hydrogen".

Claim 1, columns, line 25, delete "wherein".

Claim 45, column 8, line 51, "mask" should read --mask,--; and

Claim 45, column 8, line 52, (continue the previous paragraph on line 51) -- wherein x and y in $Ge_xSe_y$ represents molar fractions, and wherein x and y in $C_xH_y$ respectively represents moles of carbon and hydrogen.--.

Signed and Sealed this

Twelfth Day of December, 2006

JON W. DUDAS
*Director of the United States Patent and Trademark Office*